United States Patent [19]

Arias et al.

[11] 4,189,676
[45] Feb. 19, 1980

[54] SWITCHING SYSTEM UTILIZING FLEXIBLE CIRCUIT WITH TRANSMISSION LINE FOR MATCHED IMPEDANCE CONNECTIONS

[75] Inventors: Armando Arias, Tamarac; Ronald L. Scheiderer, Davie; James T. Wiggenhorn, Coral Springs, all of Fla.

[73] Assignee: Motorola, Inc., Schaumburg, Ill.

[21] Appl. No.: 896,109

[22] Filed: Apr. 13, 1978

[51] Int. Cl.² .............................................. H04B 1/04
[52] U.S. Cl. .................................. 325/125; 325/129
[58] Field of Search ............... 325/125, 129, 181, 185, 325/186, 150, 151, 397; 179/1 SW, 1 VL, 1 AT, 1 B; 328/152

[56] References Cited

U.S. PATENT DOCUMENTS 3,611,140  10/1971  Shimada .......................... 179/1 VL Primary Examiner—Marc E. Bookbinder
Attorney, Agent, or Firm—Donald B. Southard; James W. Gillman

[57] ABSTRACT

Switching system for use with a radio transmitter or the like to adapt the same for operation at two different power levels, including a flexible circuit connected to stages of the transmitter and to a switch to control the power level of the signal transmitted. The flexible circuit is very thin so that it can be positioned within the radio housing on the circuit board, and connected to terminals on the board and on the switch. The flexible circuit includes transmission line sections for making matched impedance connections to the transmitter stages for low power loss. The flexible circuit adjusts to take care of tolerances in the position of the terminals to which it is connected.

10 Claims, 6 Drawing Figures

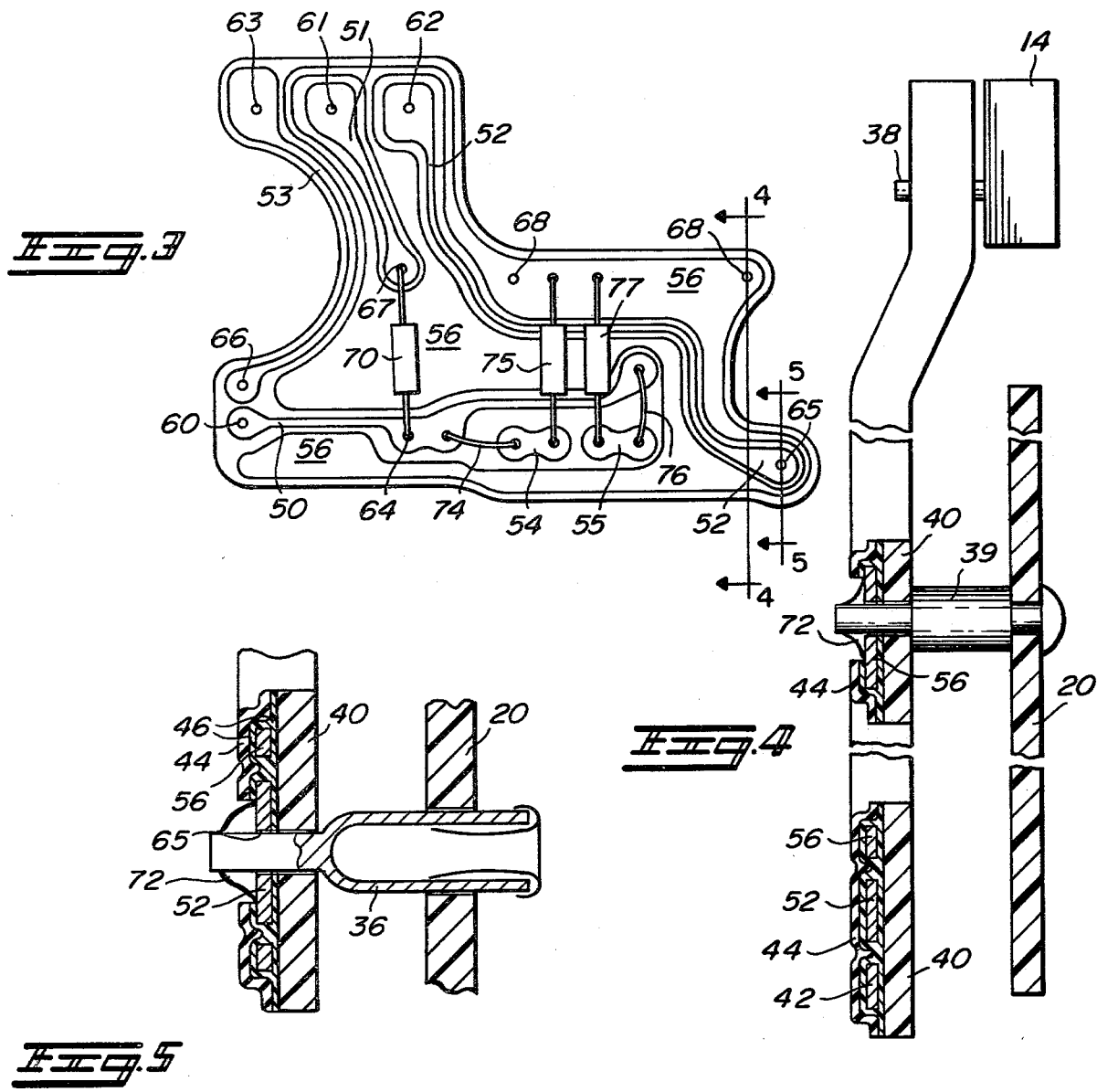
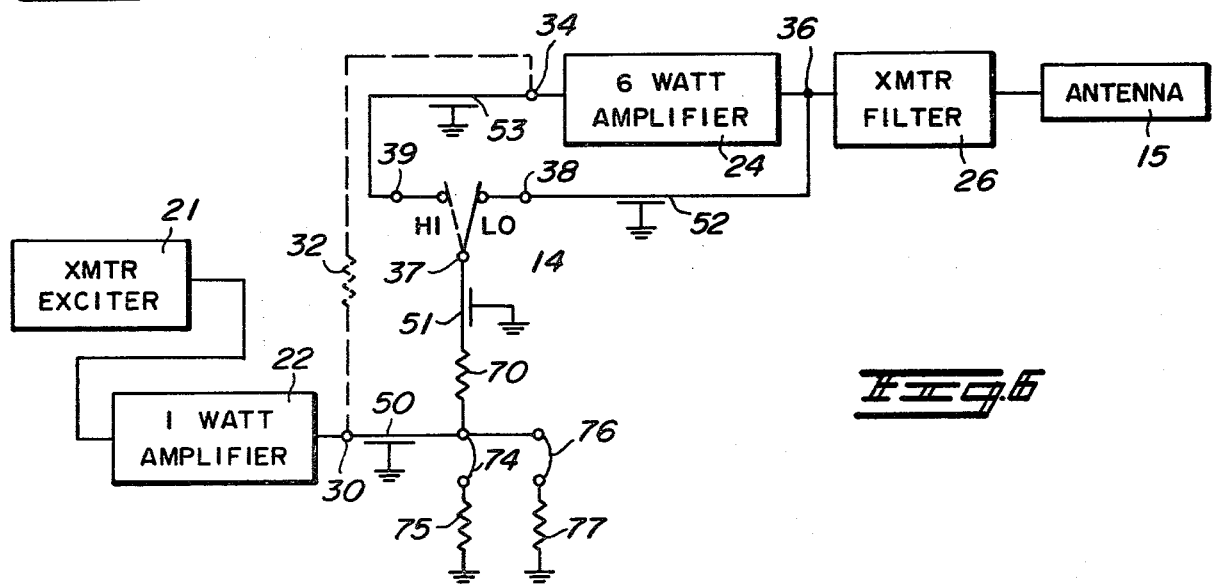

SWITCHING SYSTEM UTILIZING FLEXIBLE CIRCUIT WITH TRANSMISSION LINE FOR MATCHED IMPEDANCE CONNECTIONS

BACKGROUND OF THE INVENTION

There are significant applications for electronic apparatus, such as a radio transmitter, wherein it is desired to provide a plurality of outputs at different power levels. One such application is in marine radio equipment wherein the maximum power which can be transmitted when the boat is in port is only one watt, but a larger power output, such as six watts, is desired when the boat is at sea. Radio transmitters normally provide a low power output at some stage in the power amplifier system which may be at the proper level for the "in port" output. However, this low power output is not easily available for application to the antenna of the radio. To provide the connections and circuit conductors for connection of the low power output to the antenna requires substantial room which may not be available in the radio housing. Also the connection must provide matched impedances to conduct the radio frequency signals with low power loss. Accordingly, it is difficult to provide a circuit arrangement for adapting a small portable transmitter, such as the transmitter of a handheld two-way radio, for such "low power-high power" operation.

Although the state of the art makes it possible to initiate the design of a new radio transmitter which has low power and high power outputs which are selectively transmitted, the cost of such a new design is substantial and might not be easily justified by the number of radios of this type that will be used. For this reason, it is desired to provide a compact circuit arrangement for adapting an existing radio transmitter for "low power-high power" operation.

SUMMARY OF THE INVENTION

It is an object of this invention to provide a switching system for use with an electronic device to selectively provide low and high power outputs therefrom.

A further object of this invention is to provide a switching circuit which can be easily connected to a radio device to provide two power output levels therefrom, and which requires small space so that it can be provided within the housing of the radio device.

Another object is to provide a switching system for use with a radio transmitter to provide transmission of low power and high power radio signals, and which provides matched impedance connections to the stages of the transmitter.

Still another object is to provide a switching arrangement for a radio transmitter which includes a thin flexible circuit adapted to be positioned adjacent to and connected to the circuit board of the transmitter, and having transmission line sections for making connections between terminals on the circuit board to a switch device, for controlling the power level of signals transmitted.

In accordance with the invention, a switching system is provided for a small radio transmitter, such as the transmitter of a hand-held, two-way radio, which controls the same so that a low power signal and a high power signal are selectively transmitted. The system includes a thin flexible circuit structure having a conductive layer positioned between outside insulating layers, and which forms a plurality of transmission line sections. The flexible circuit is positioned against the circuit board of the radio transmitter and is connected to terminal pins thereon so that it takes very little space and can be provided within the radio housing. The conductive layer is in the form of a plurality of conductors which form a plurality of transmission line sections, which sections are connected between stages of the transmitter and a switch to selectively apply signals from a low power stage of the transmitter to the transmitter output filter, or to apply such signals to a power amplifier which is connected to the output filter. The switch is a single pole, double throw, switch which may be available in the radio. The circuit may also include portions of the conductive layer for connecting impedance devices, such as resistors, to the signal conductor to attenuate signals from the low power stage so that the low power signal transmitted falls within the allowed limits.

BRIEF DESCRIPTION OF THE DRAWINGS

FIG. 3 shows the flexible circuit structure of the invention;

FIG. 4 illustrates the connection of the flexible circuit structure of FIG. 3 to the radio transmitter, and is taken along the lines 4—4 of FIG. 3;

FIG. 5 shows the structure of the flexible circuit in more detail and is taken along the lines 5—5 of FIG. 3; and FIG. 6 is a block and schematic diagram illustrating the switching system and connection thereof to a radio transmitter.

DETAILED DESCRIPTION OF THE INVENTION

Figure 1:
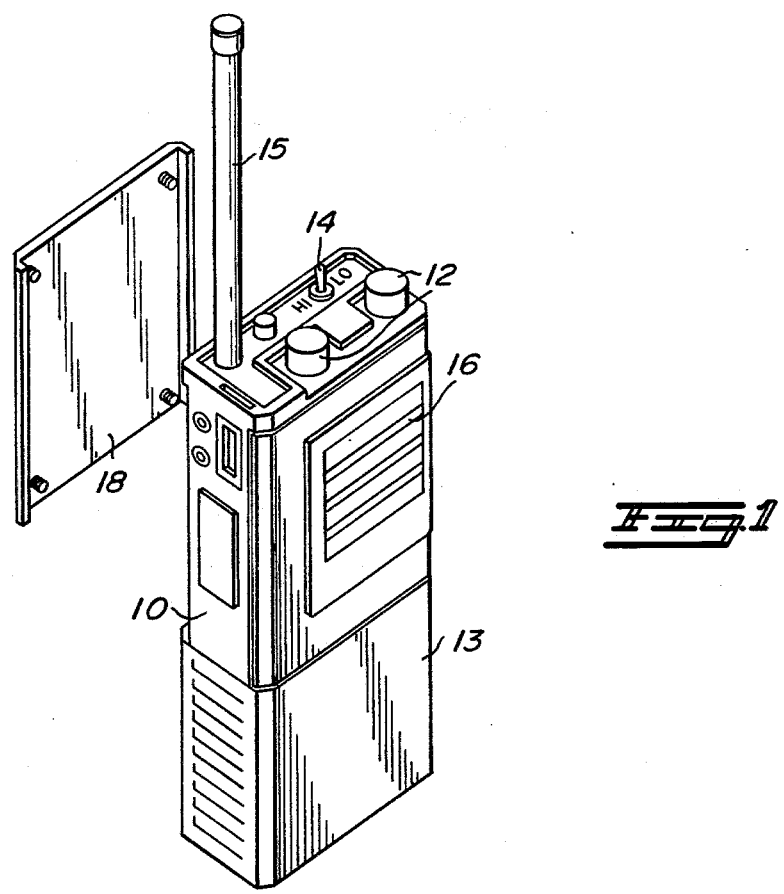
FIG. 1 is a perspective view of a radio device to which the invention is applicable, showing the removable back cover plate in open position.

FIG. 1 shows a hand-held, two-way radio transmitter and receiver of known construction. This includes a housing 10 having controls 12, including a two position switch 14, and an antenna 15 extending from the top housing wall. The housing 10 has a grill 16 near the top of the front wall for the passage of sound to a microphone of the radio transmitter, and from a speaker of the radio receiver. The housing 10 includes a removable back cover plate 18 which provides access to the components of the radio device, and particularly to a circuit board of the transmitter. Attached to the bottom of the radio housing 10 is a battery 13, which may be removable, providing a radio transmitter and receiver device which is self-contained and requires no connection to outside apparatus.

Figure 2:
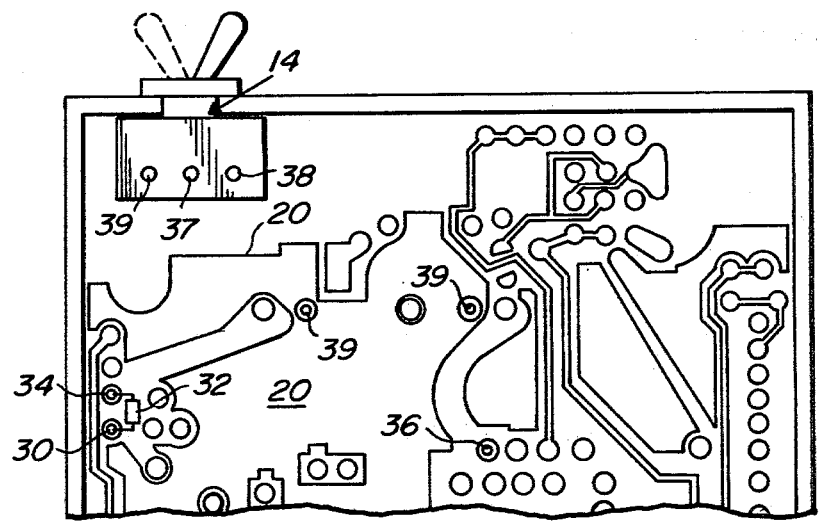
FIG. 2 shows the circuit board for the radio transmitter of the device of FIG. 1, which is exposed when the cover plate is removed.

FIG. 2 shows a portion of the back of the radio device which is exposed when the cover plate 18 is removed (FIG. 1). This shows the switch 14 and the circuit board 20 for the radio transmitter. As illustrated in FIG. 6, the radio transmitter includes a transmitter exciter 21, a one watt amplifier 22, a six watt amplifier 24, and a transmitter filter 26 which is connected to the antenna 15, all as known in the art. The output terminal 30 of the amplifier 22 is normally connected by resistor 32 to the input terminal 34 of the amplifier 24, as is shown by FIG. 2. Resistor 32 is also shown by dotted lines in FIG. 6. The output of amplifier 24 is connected to the input of the transmitter filter 26, with this connection being brought out by conductive pin or terminal 36. The switch 14 includes terminal pins 37, 38 and 39, this switch being a single pole, double throw switch which selectively connects the terminal 37 to the terminals 38 and 39. These terminals are shown on FIGS. 2 and 6.

FIGS. 3, 4 and 5 illustrate the flexible circuit structure and the connection thereof to the components of the radio transmitter which are shown in FIGS. 2 and 6, and which are described above. This circuit structure includes a base layer 40 of plastic insulating material on which a conductive layer 42 is placed, and a cover layer 44 (FIGS. 4 and 5). The base layer 40 and the cover layer 44 may be formed of polymide material, with the base layer 40 being about 0.002 inches thick and the cover layer 44 being about 0.001 inches thick, for example. The conductive layer 42 may be soft rolled annealed copper. Laminating adhesive layers 46 are placed between the insulating layers and the copper conductive layer, and the structure is laminated into a single flexible sheet by the application of heat and pressure, as is known in the art. FIG. 3 illustrates the flexible circuit structure with a transparent cover layer 44, and shows the various conductors formed by the conductive layer 42. This includes signal conductors 50, 51, 52 and 53, connector pads 54 and 55, and ground conductor 56. The signal conductors 50 to 53 each has an opening at each end thereof to facilitate the making of a connection to a pin or wire terminal. The opening 60 in conductor 50 is for receiving the output terminal 30 of amplifier 22 (FIGS. 2 and 6). When the flexible circuit is connected to the radio transmitter, the resistor 32 connecting terminals 30 and 34 (FIG. 2) is removed so that there is no connection from the output of amplifier 22 to the input of amplifier 24. The flexible circuit is positioned on the circuit board 20 with the opening 60 about the pin or terminal 30, and a solder connection is made between the conductor 50 and the terminal 30, as will be explained. Conductors 51, 52 and 53 have openings 61, 62 and 63 therein to receive the terminal 37, 38 and 39 of the switch 14, respectively. Signal conductor 52 has an opening 65 to receive conductor pin 36, which is connected to the output of amplifier 24 and to the input of filter 26, and signal conductor 53 has an opening 66 to receive the terminal 34 connected to the input of amplifier 24. The registration of the openings in the conductors with the terminals or pins on the circuit board 20 will be apparent by viewing FIGS. 2 and 3.

The flexible circuit provides a connection from output terminal 30 of amplifier 22, which extends through signal conductor 50 from the opening 60 therein to the opening 64 into which a lead of resistor 70 may be soldered. The other lead of resistor 70 extends into opening 67 of the conductor 51 and the circuit extends through this signal conductor to opening 61 therein which receives the terminal 37 of switch 14. When the switch is in the low power position, terminal 37 is connected to terminal 38, and the circuit extends therefrom through signal conductor 52 to conductive pin 36 at the input of the filter 26. The signal from the amplifier 22 is therefore applied through conductor 50, resistor 70, conductor 51, switch 15 and conductor 52 to the input of the transmitter filter 26. The resistor 70 may have the same value as the resistor 32 (FIG. 2) which had been connected to the output of the amplifier 22. During this low power operation, although the amplifier 24 remains connected to the filter 26, no input is applied to this amplifier and there will be no output therefrom. The above connections are also shown by FIG. 6.

For high power operation, the switch 14 is activated to its other position (shown dotted in FIG. 6) and the signal applied to terminal 37 thereof is connected to terminal 39, and through signal conductor 53 of the flexible circuit to terminal 34, which is the input to the power amplifier 24. Thus the signal applied through the flexible circuit and switch 14 is amplified by power amplifier 24 and applied to filter 26 to provide the high power output of the transmitter.

It will be noted from FIG. 3 that the ground conductor 56 extends along both sides of each of the signal conductors 50, 51, 52 and 53. This ground conductor has openings 68 therein which are positioned to receive pins 39 extending from the chassis 20. The ground conductor 56 is soldered to the pins 39 so that conductor 56 is held at the ground potential of the radio. Additional connections of the conductor 56 to the radio ground may be provided if this is deemed desirable. The signal conductors together with the ground conductor form transmission lines which conduct the radio frequency signals with a minimum of power loss. The spacing of the ground conductor 56 from the signal conductors controls the impedance of the transmission lines, and this spacing can be selected to provide lines having a characteristic impedance of 50 ohms, for example, to provide matched impedance connections to the stages of the transmitter.

FIG. 5 illustrates the connection of the terminals on the circuit board 20 to the conductors of the flexible circuit. This shows the connection of terminal 36 to signal conductor 52. The terminal 36 is illustrated as a tubular conductor which forms a socket for receiving a plug-in connector on the other side of the circuit board 20, with a projecting pin which extends to the opening 65 in the conductor 52. The opening in the insulating base layer 40 and the opening 65 in conductor 52 may be somewhat larger than the terminal pin 36 to allow for tolerance in the construction of the radio and the flexible circuit. The opening in the cover layer 44 is still larger so there is room for solder 72 about the pin 36 and on the surface of conductor 52 to make a good electrical connection therebetween. This facilitates the connection of the flexible circuit to the circuit board 20 and to the switch 14. As shown in FIG. 4, the circuit can flex to compensate for small differences in position of the switch 14 from the plane of the circuit board 20. FIG. 4 also shows the solder connection between one grounding pin 39 and the ground conductor 56. This pin is illustrated as a stake pin, but it is to be pointed out that the flexible circuit can be connected to pins of various different configurations.

As previously stated, the conductive layer 42 of the flexible circuit includes connector pads 54 and 55 (FIG. 3) which can be used to connect resistors between the signal conductor 50 and the ground conductor 56. Pad 54 is connected to signal conductor 50 by jumper 74, and resistor 75 is connected from the pad 54 to ground connector 56. Similarly pad 55 is connected to signal conductor 50 by jumper 76, and resistor 77 is connected from the pad 55 to the ground conductor 56. This is illustrated in FIGS. 3 and 6. In one application, the output of amplifier 22 may be somewhat greater than one watt and the resistors 75 and/or 77 are used to reduce the signal applied to the transmitter filter 26 to a level of one watt. The level can be easily changed by open circuiting one or both of the jumpers 74 and 76 without otherwise altering the flexible circuit which is, in effect, sealed so that it cannot be changed.

The switch 14 is a toggle switch provided with the radio and may be used for different switching functions. In some applications, it is used to selectively enable a tone coded squelch circuit in the radio receiver. This operation is not required in the marine application so that the switch is available for the "low power-high power" switching system.

As is apparent from the above, the switching arrangement described takes up little space as the flexible circuit is quite thin and can be positioned on the circuit board within the housing. The flexible circuit provides the connectors required between the transmitter circuits and the switch, and the connections are made by transmission lines which provide matched impedance connections so that the power loss of the radio frequency signal is minimized. The switching arrangement can be used with an existing radio transmitter which provides signals of a single power level, to cause such transmitter to selectively provide low power and high power outputs by operation of a switch which is available to the user of the transmitter.

What is claimed is:

1. In electronic signalling apparatus having a first signal circuit with an output terminal providing an output carrier signal of a relatively low power level, an amplifier stage having input and output terminals and acting to increase the level of the carrier signal applied thereto, and a second signal circuit having an input terminal connected to the output terminal of the amplifier stage;
   a switching circuit for selectively switching the output of the first signal circuit between the inputs of the amplifier stage and the second signal circuit, including in combination,
   a switch device having first, second and third terminals, and switch means selectively connecting said first terminal between said second and third terminals,
   a flat flexible circuit structure having first, second and third transmission lines of a predetermined characteristic impedance encapsulated thereon,
   means connecting said first transmission line between the output terminal of the first signal circuit and said first terminal of said switch device,
   means connecting said second transmission line between said second terminal of said switch device and the input terminal of the second signal circuit, and
   means connecting said third transmission line between said third terminal of said switch device and the input terminal of the amplifier stage,
   whereby operation of said switch device to a first condition provides a matched impedance connection through said first and second transmission lines from the first signal circuit to the second signal circuit, and operation of said switch device to a second condition provides a matched impedance connection through said first and third transmission lines from the first signal circuit to the amplifier stage which provides an amplified signal to the second signal circuit.

2. The combination of claim 1 wherein said flat circuit structure includes a flat insulating base formed of insulating material with conductive material thereon and an insulating cover layer thereover, said conductive material forming a plurality of signal conductors and a ground conductor which make up said transmission lines.

3. The combination of claim 2 wherein said conductive material includes first and second signal conductors for transmission lines, and further including resistor means connecting said signal conductors to form a continuous circuit between the output terminal of the first signal circuit and said first terminal of said switch device.

4. The combination of claim 3 including further resistor means connecting said first signal conductor and said ground conductor for attenuating the signal from the first signal circuit.

5. The combination of claim 4 wherein said further resistor means includes a plurality of resistors, and said conductive material forms a plurality of conductor pads for making connections to said resistors, and further including jumper connectors for connecting said conductor pads to said signal conductor of said first transmission line.

6. The combination of claim 2 wherein said insulating material and said conductive material have characteristics and configurations such that said transmission lines have a characteristic impedance of 50 ohms.

7. In a radio transmitter adapted to be operated at a first relatively low power level and a second relatively high power level, which transmitter includes a circuit board having a first signal terminal providing the relatively low power level ouput, a power amplifier having input and output terminals on the circuit board, an output filter having an input terminal connected to the output terminal of the power amplifier, and a switch device having first, second and third terminals and switch means selectively connecting the first terminal to the second and third terminals;
   a switching circuit for selectively applying the low power level output from the first signal terminal and the relatively high power level output from the output terminal of the power amplifier to the output filter including in combination,
   a flat circuit structure adapted to be positioned adjacent the circuit board and the switch device and including an insulating base, an insulating cover and a layer of conductive material forming first, second and third transmission lines,
   first means connecting said first transmission line between the first signal terminal and the first terminal of the switch device,
   second means connecting said second transmission line between the second terminal of the switch device and the input terminal of the output filter, and
   third means connecting said third transmission line between the third terminal of the switch device and the input terminal of the power amplifier.

8. The combination of claim 7 wherein said flat circuit structure is flexible and said insulating base and said cover are formed of polymide insulating material, and wherein said layer of conductive material is soft rolled annealed copper, said conducting material including portions forming signal conductors and a ground conductor which are of configurations to form transmission lines having a characteristic impedance of 50 ohms.

9. The combination of claim 7 wherein said circuit structure includes a fourth transmission line and said first means includes resistor means connecting said first and fourth transmission lines in series between the first signal terminal and the first terminal of the switch device.

10. The combination of claim 9 wherein said layer of conductive material of said circuit structure includes a portion forming a conductor pad, and further including resistor means connecting said pad to said ground conductor of said transmission lines, and a jumper conductor connecting said pad to the signal conductor of said first transmission line.

* * * * *

UNITED STATES PATENT AND TRADEMARK OFFICE
CERTIFICATE OF CORRECTION

PATENT NO. : 4,189,676
DATED : February 19, 1980
INVENTOR(S) : Armando Arias, Ronald L. Scheiderer, James T. Wiggenhorn It is certified that error appears in the above-identified patent and that said Letters Patent are hereby corrected as shown below:

Column 3, line 41, delete "terminal" and insert --terminals--.

Column 4, line 40, delete "tolerance" and insert --tolerances--.

Column 4, line 60, delete "connector" and insert --conductor--.

Column 5, line 13, before "housing", insert --radio--.

Signed and Sealed this

Tenth Day of June 1980

[SEAL]

Attest:

SIDNEY A. DIAMOND

Attesting Officer

Commissioner of Patents and Trademarks